United States Patent
Struppe et al.

(10) Patent No.: US 9,568,574 B2
(45) Date of Patent: Feb. 14, 2017

(54) PULSE SEQUENCE FOR HOMONUCLEAR J-DECOUPLING DURING NMR DATA ACQUISITION

(71) Applicant: Bruker Biospin Corporation, Billerica, MA (US)

(72) Inventors: Jochem O. Struppe, Gloucester, MA (US); Leonard J. Mueller, Riverside, CA (US)

(73) Assignee: Bruker Biospin Corporation, Billerica, MA (US)

( * ) Notice: Subject to any disclaimer, the term of this patent is extended or adjusted under 35 U.S.C. 154(b) by 821 days.

(21) Appl. No.: 13/796,804

(22) Filed: Mar. 12, 2013

(65) Prior Publication Data

US 2013/0257425 A1    Oct. 3, 2013

Related U.S. Application Data

(60) Provisional application No. 61/609,655, filed on Mar. 12, 2012.

(51) Int. Cl.
G01R 33/46 (2006.01)

(52) U.S. Cl.
CPC ............ *G01R 33/46* (2013.01); *G01R 33/4608* (2013.01)

(58) Field of Classification Search
CPC .......................... G01R 33/46; G01R 33/4608
See application file for complete search history.

(56) References Cited

U.S. PATENT DOCUMENTS

| | | | | |
|---|---|---|---|---|
| 5,117,186 A * | 5/1992 | Burum | ............... | G01R 33/4641 324/300 |
| 5,245,284 A * | 9/1993 | Burum | ............... | G01R 33/4641 324/300 |
| 5,926,023 A * | 7/1999 | De Groot | .......... | G01R 33/4641 324/300 |
| 6,150,179 A * | 11/2000 | Went | ........................ | C07K 1/00 436/173 |
| 6,184,683 B1 * | 2/2001 | Emsley | ............. | G01R 33/4641 324/307 |
| 2006/0099717 A1 | 5/2006 | Takasugi et al. | | |
| 2010/0072995 A1 | 3/2010 | Nishiyama | | |
| 2011/0001477 A1 | 1/2011 | Vasos et al. | | |
| 2011/0274626 A1 | 11/2011 | Duckett et al. | | |

OTHER PUBLICATIONS

Chan, "Solid-State NMR Techniques for the Structural Determination of Amyloid Fibrils", Top Curr Chem 306: 47-88, 2011.
Loening et al., "A comparison of NCO and NCA transfer methods for biological solid-state NMR spectroscopy", Journal of Magnetic Resonance 214 (2012) 81-90.
Nielsen et al., "Dipolar Recoupling", Top Curr Chem 306: 1-45, 2011.
Weingarth et al., "Efficiency at high spinning frequencies of heteronuclear decoupling methods designed to quench rotary resonance", Solid State Nuclear Magnetic Resonance 40 (2011) 21-26.

* cited by examiner

*Primary Examiner* — Dixomara Vargas
(74) *Attorney, Agent, or Firm* — O'Shea Getz P.C.

(57) ABSTRACT

A method is long observation based selective homonuclear decoupling includes acquiring one of CO or CA time domain signals during rotor synchronized breaks between decoupling pulses.

3 Claims, 6 Drawing Sheets

PULSE SEQUENCE FOR HOMONUCLEAR J-DECOUPLING DURING NMR DATA ACQUISITION

CLAIM OF PRIORITY

This patent application claims priority from U.S. Provisional Patent Application 61/609,655 filed Mar. 12, 2012, which is hereby incorporated by reference.

FIELD OF TECHNOLOGY

The invention relates to the field of nuclear magnetic resonance (NMR), and in particular to NMR data acquisition including a pulse sequence for homonuclear J-coupling.

RELATED ART

Many pulse sequences used in biological solid state NMR acquire either aliphatic carbons or carbonyl carbons. J-coupling between alpha carbons and carbonyl carbons in polypeptide chains can considerably broaden the resonances and lead to poorly resolved spectra in particular for large proteins.

It is long known, that J-decoupling on carbons leads to increased resolution. Thus far J-decoupling was used in the indirect dimension or by acquiring 2 sub spectra, one in phase and the other in antiphase such that addition or subtraction of the sub spectra led to well resolved spectra; the technique is widely known as IPAP and commonly used in liquids NMR. Homonuclear decoupling on Ca or CO was used in Bertini's group about ten years ago and found technically too challenging compared to the easier to setup IPAP type experiments for Bertini's famous CaNCO, NCaCO and NCOCa experiments for 13C direct observe. In solid State NMR, the group of Professor Len Mueller developed similar J-driven homo- and heteronuclear correlation experiments based on Constant Time Uniform sign Cross peak COSY which came from the UC2QF COSY.

An advantage of the CT experiment is J-decoupling in the indirect dimensions of the 2 and 3D experiments.

However, there was the still considerable line broadening in the acquisition dimension through J-coupling of uniformly enriched proteins.

SUMMARY OF THE INVENTION

In one aspect, a homonuclear decoupling sequence removes the J coupling in the acquisition dimension and provides highly resolved 1 and 2 and 3D spectra in the acquisition dimension, thus providing either access to even larger proteins or access at all to proteins which are not highly ordered. The sequence includes selective, rotor synchronized decoupling pulses on $C^\alpha$ and C' while acquiring $C^\alpha$ and C' time domain signals in the rotor synchronized breaks between the decoupling pulses. Signal processing after the data acquisition removes decoupling sidebands and back predicts signal during the pulse delays, such that the sensitivity of the experiment is increased by a factor of 1.5 to two.

First experiments have given a 1.41 signal increase and a factor of almost 2 in resolution.

With the right filter functions, this experiment is easy to implement and does not require sophisticated setup. It is broadly applicable to all BioSolids experiments if one can afford to look at either only $C^\alpha$ and C' sub spectra during data acquisition. It saves time as typically collection of IP and AP spectra cost the time for a second 2D or 3D spectrum whereas this technique allows running just one 2D or 3D spectrum to yield the same or better resolution and same or better S/N as IPAP which gives a SQRT2 improvement of S/N.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
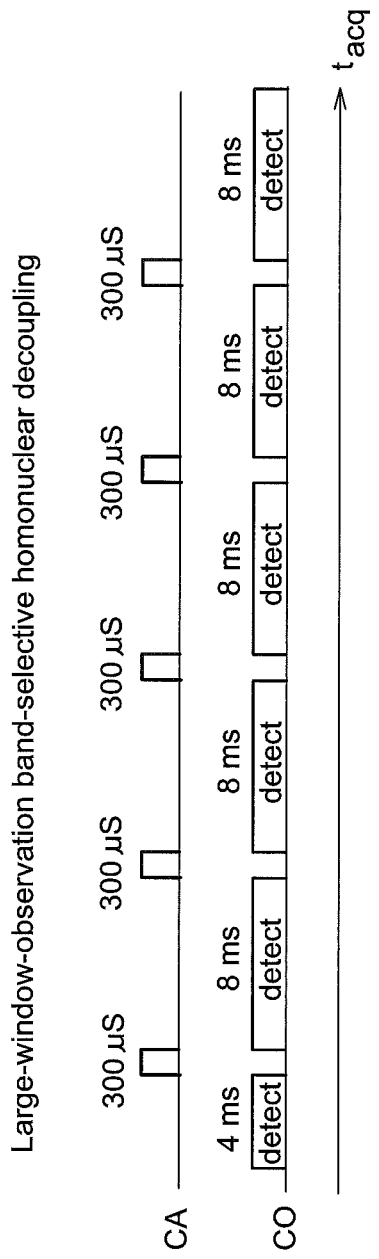
FIG. 1 is a plot of a typical timing sequence for long-observation-window band-selective decoupling.

Advances in sample preparation, hardware design, and pulse-sequence methodologies have progressed to the point where it is common in solid-state NMR spectroscopy to resolve J-couplings between 13C nuclei in U-13C,15N-labeled proteins. In many cases, J-coupling interactions are now the dominant source of inhomogeneous broadening. Here, we present a general method for band-selective homonuclear decoupling capable of removing the J-coupling interaction between Cα and C' spins during direct 13C acquisition. This windowed approach introduces negligible (~300 µs) pulse breaks into much larger (e.g., >4 ms) sampling windows to efficiently refocus the J-coupling interaction during detection and can be appended to any existing correlation method that detects on 13C. A typical timing sequence is shown in FIG. 1.

Figure 2:
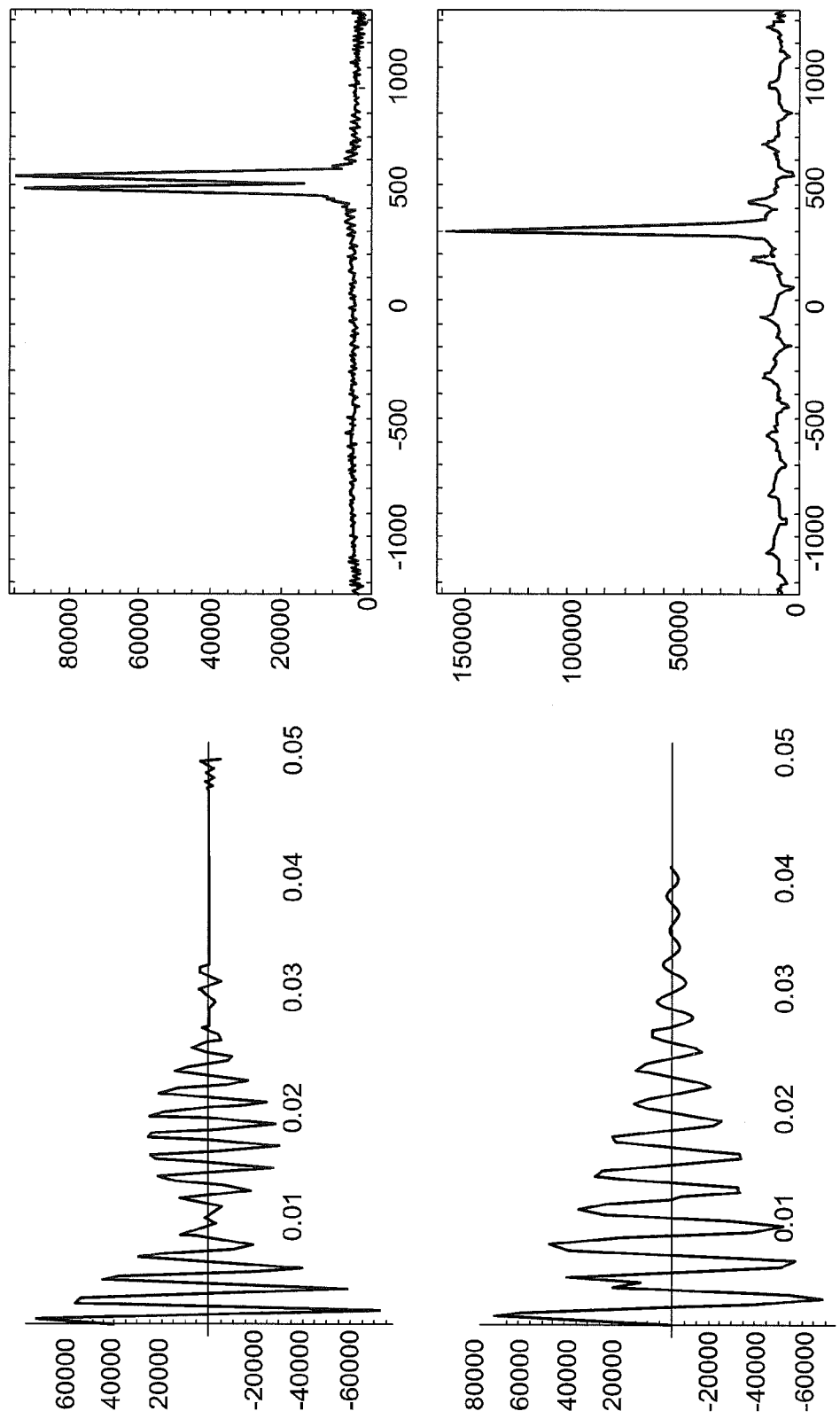
FIG. 2 illustrates free induction decays and spectra for glycine with (bottom) and without (top) LOW-BASHD; note the effect of the first pulse delay period on the bottom FID at 0.004 seconds. Data have been left-shifted to account for the group delay.
Figure 3:
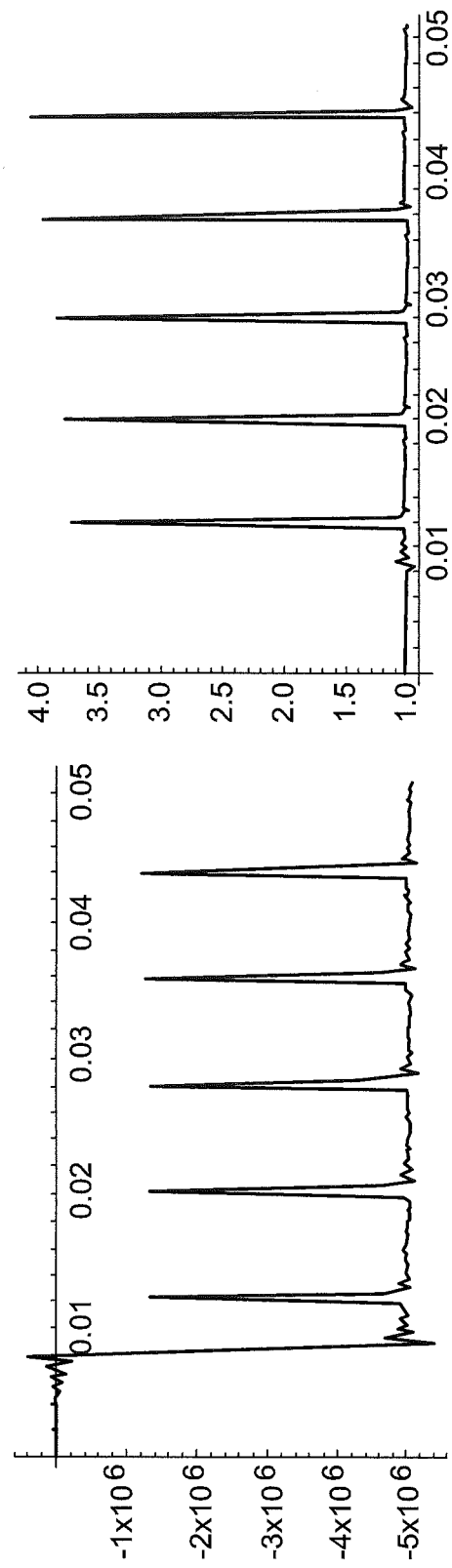
FIG. 3 illustrated digitized signal for a constant input under the LOW-BASHD detection timing and (right) the LOW-BASHD time-domain filter for removing the sidebands in FIG. 2 (note, group delay has not been removed)
Figure 4:
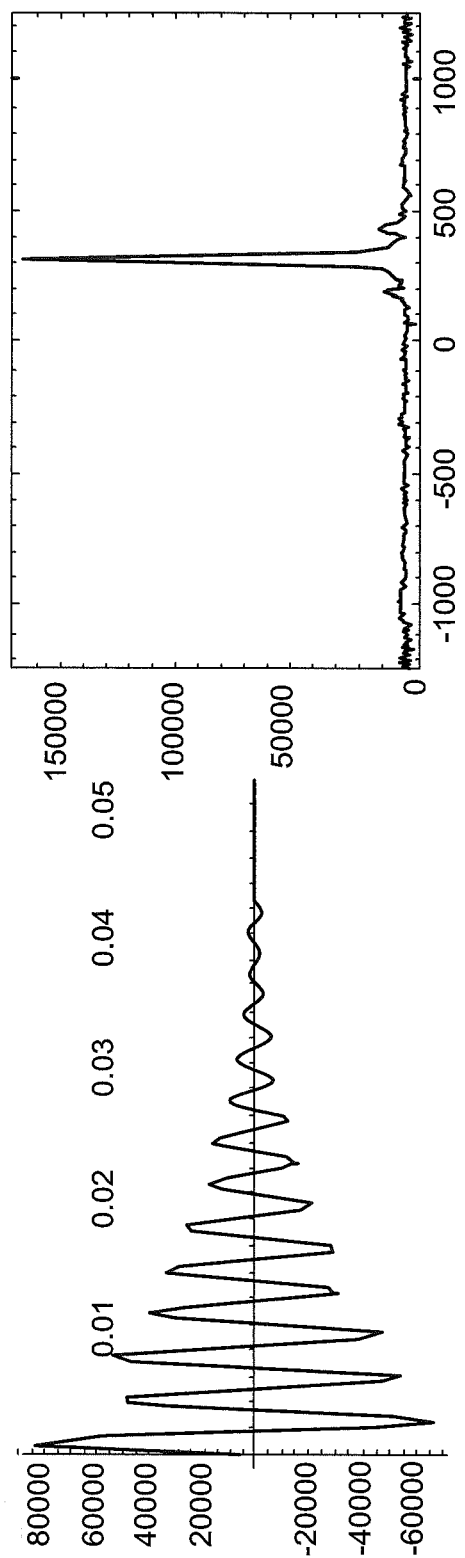
FIG. 4 illustrates LOW-BASHD filtered FID for glycine removes the sidebands in the frequency domain. The FID is the product of the FID shown in FIG. 2 (bottom) with the left-shifted LOW-BASHD time-domain filter in FIG. 3; the remaining sidebands are not from the pulse delay breaks, but are true "decoupling sidebands.

This sampling scheme introduces short, periodic breaks into the observed FID, which in turn leads to a series of frequency-domain sidebands on the resulting spectroscopic lines as shown in FIG. 2. The effect of the pulse breaks on the FID are relatively minor because the digital filtration already applied to the raw data convolutes a filter decay to the signal so that it does not have sufficient time to fully decay to zero. Here the data are acquired with dw equal to 200 us. At short dw times, the signal does indeed fall to zero during these periods. While the sideband intensities are small enough to be negligible in many cases, it is desirable to remove them in other cases. There are many ways this can be accomplished including linear prediction, interpolation, and reference deconvolution. Because the introduction of the time-domain pulse breaks has a characteristic time-domain response that is independent of the input signal and is calculable from the timing sequence and digital filtration parameters, deconvlution in the frequency domain through the application of a time-domain filter is in principle straight-forward. Although this filter is calculatable, it can also be determined experimentally. FIG. 3 shows the time-domain signal for a constant amplitude input (in this case the dc offset of the receiver) digitized analogously to the signal in FIG. 2. Here the effect of the pulse breaks are clearly evident. This time-domain signal can be inverted (after the initial group delay period) to produce the time-domain filter function shown in FIG. 3. FIG. 4 shows the filter applied to the glycine LOW-BASHD data.

Figure 5:
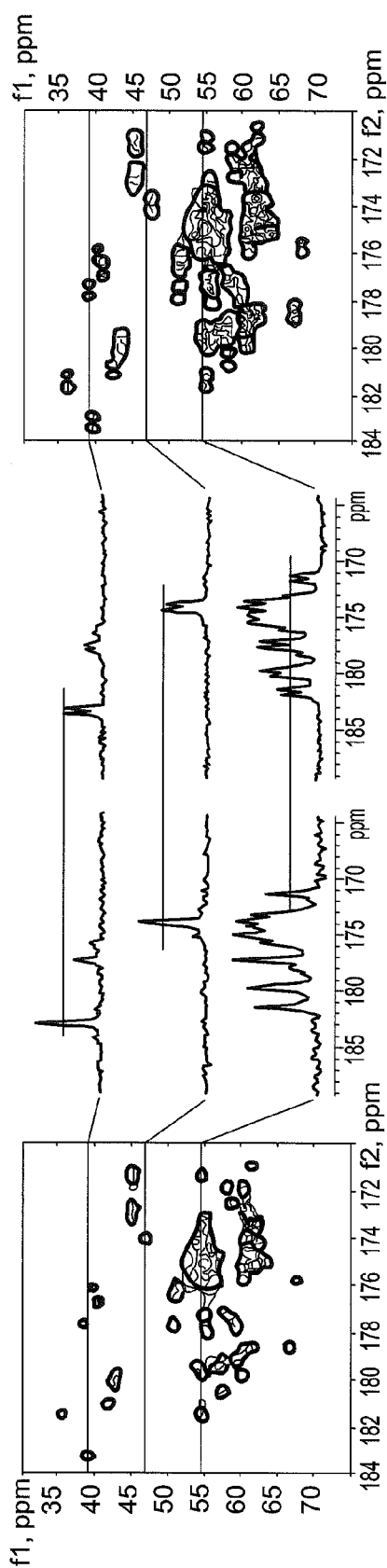
FIG. 5 is a plot based upon constant-time CACO correlation using the CTUC COSY with and without BASHD detection for GB1; both spectra acquired under identical conditions and 1D traces shown on the same scale.

FIG. 5 is a plot based upon constant-time CACO correlation using the CTUC COSY with and without BASHD detection for GB1. Both spectra acquired under identical conditions and 1D traces shown on the same scale.

Figure 6:
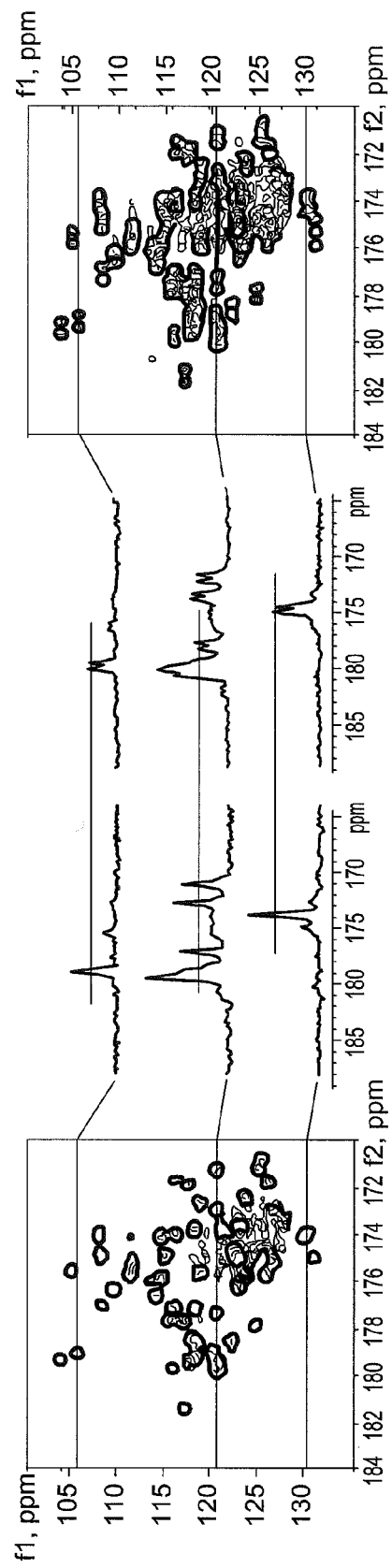
FIG. 6 is a plot based upon NCO correlation using SPECIFIC-CP with and without BASHD detection for GB1; both spectra acquired under identical conditions and 1D traces shown on the same scale.

FIG. 6 is a plot based upon NCO correlation using SPECIFIC-CP with and without BASHD detection for GB1. Both spectra acquired under identical conditions and 1D traces shown on the same scale.

While various embodiments of the present invention have been disclosed, it will be apparent to those of ordinary skill in the art that many more embodiments and implementations are possible within the scope of the invention. Accordingly, the present invention is not to be restricted except in light of the attached claims and their equivalents.

What is claimed is:

1. A method of long observation based selective homonuclear decoupling that removes J-coupling interactions between $C^\alpha$ and C' nuclei from $^{13}C$ acquisition in a nuclear magnetic resonance (NMR) spectrometer, the method comprising:
   acquiring time domain signals of one partner of a J-coupled $C^\alpha$ and C' pair from the NMR spectrometer during rotor synchronized breaks between applying decoupling pulses to a second partner of the J-coupled pair; and
   applying, in the NMR spectrometer, the decoupling pulses to a second partner of the J-coupled $C^\alpha$ and C' pair;
   providing, from the NMR spectrometer, a free induction decay signal.

2. The method of claim 1, where the one partner of the J-coupled $C^\alpha$ and C' pair is C'.

3. The method of claim 1, where the second partner of the J-coupled $C^\alpha$ and C' pair is $C^\alpha$.

* * * * *